(12) United States Patent
Park et al.

(10) Patent No.: US 7,583,023 B2
(45) Date of Patent: Sep. 1, 2009

(54) ORGANIC ELECTROLUMINESCENT DISPLAY DEVICE AND METHOD OF FABRICATING THE SAME

(75) Inventors: Jae-Yong Park, Gyeonggi-do (KR); Kwan-Soo Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 469 days.

(21) Appl. No.: 11/022,770

(22) Filed: Dec. 28, 2004

(65) Prior Publication Data
US 2005/0140289 A1 Jun. 30, 2005

(30) Foreign Application Priority Data
Dec. 29, 2003 (KR) .................. 10-2003-0099359

(51) Int. Cl.
*H01J 1/62* (2006.01)
*H01J 9/00* (2006.01)

(52) U.S. Cl. .................. 313/506; 313/501; 313/503; 313/504; 313/505; 445/24; 445/25

(58) Field of Classification Search ......... 313/501–512; 315/169.3, 169.4; 257/40, 79; 428/690; 345/30, 36, 44, 45; 252/72, 181.1, 194; 445/24, 25
See application file for complete search history.

(56) References Cited

U.S. PATENT DOCUMENTS

| | | | | |
|---|---|---|---|---|
| 5,427,858 | A * | 6/1995 | Nakamura et al. | 428/421 |
| 6,150,259 | A * | 11/2000 | Wu et al. | 438/628 |
| 6,175,345 | B1 | 1/2001 | Kuribayashi et al. | |
| 6,339,291 | B1 * | 1/2002 | Codama | 313/506 |
| 6,548,961 | B2 * | 4/2003 | Barth et al. | 315/169.3 |
| 6,922,015 | B2 * | 7/2005 | Park et al. | 313/506 |
| 2002/0024096 | A1 * | 2/2002 | Yamazaki et al. | 257/359 |
| 2002/0158577 | A1 | 10/2002 | Shimoda et al. | |
| 2003/0045021 | A1 * | 3/2003 | Akai | 438/99 |
| 2003/0122497 | A1 * | 7/2003 | Ko et al. | 315/169.3 |
| 2003/0178936 | A1 * | 9/2003 | Park et al. | 313/505 |

(Continued)

FOREIGN PATENT DOCUMENTS

JP 7-211455 8/1995

(Continued)

OTHER PUBLICATIONS

Young Joon Yoon, et al. "Development of Thin Film Getters For Field Emission Display." *The Journal of Korean Vacuum Science & Technology.* vol. 3, No. 1, Apr. 1999, pp. 74-78.

*Primary Examiner*—Joseph L Williams
*Assistant Examiner*—Elmito Breval
(74) *Attorney, Agent, or Firm*—Morgan Lewis & Bockius LLP

(57) ABSTRACT

An organic electroluminescent device includes first and second substrates spaced apart from each other, the first and second substrates including a pixel region, an array element layer on an inner surface of the first substrate, the array element layer including a switching element and a driving element connected to the switching element, an organic electroluminescent diode on an inner surface of the second substrate, an absorbent element on one of the array element layer and the organic electroluminescent diode, a protective layer on the absorbent element, and a connection electrode electrically connecting the array element layer and the organic electroluminescent diode.

20 Claims, 5 Drawing Sheets

U.S. PATENT DOCUMENTS

| | | | |
|---|---|---|---|
| 2003/0205970 A1* | 11/2003 | Park et al. | 313/506 |
| 2003/0230978 A1* | 12/2003 | Hishida | 313/512 |
| 2004/0164671 A1* | 8/2004 | Noguchi | 313/504 |

FOREIGN PATENT DOCUMENTS

| | | |
|---|---|---|
| JP | 2001-177509 | 4/2001 |
| KR | 2002-0047889 | 6/2002 |
| KR | 2004-0079476 | 9/2004 |
| WO | WO-02/078101 | 10/2005 |

* cited by examiner

ORGANIC ELECTROLUMINESCENT DISPLAY DEVICE AND METHOD OF FABRICATING THE SAME

The present application claims the benefit of Korean Patent Application No. 2003-0099359 filed in Korea on Dec. 29, 2003, which is hereby incorporated by reference.

BACKGROUND OF THE INVENTION

1. Field of the Invention

The present invention relates to a display device, and more particularly, to a dual panel type organic electroluminescent (EL) display device and a method of fabricating the same.

2. Discussion of the Related Art

An organic electroluminescent (EL) display device, which is a type of flat panel display, is a self-emission type display. In general, the organic EL display device emits light by injecting electrons from a cathode and holes from an anode into an emission layer, combining the electrons with the holes, generating an exciton, and transitioning the exciton from an excited state to a ground state. Accordingly, the organic EL display device does not require an additional light source and has a light weight, thin profile, and compact size.

The organic EL display device also has other excellent characteristics such as low power consumption, superior brightness, fast response time and simple fabrication process. As a result, the organic EL display device is regarded as a promising display for next-generation consumer electronic applications, such as cellular phones, car navigation system (CNS), personal digital assistants (PDA), camcorders, and palmtop computers.

There are two types of organic EL display devices: passive matrix type and active matrix type. While both the passive matrix organic EL display device and the active matrix organic EL display device have simple structures and are formed by a simple fabricating process, the passive matrix organic EL display device requires a relatively high amount of power to operate. In addition, the display size of a passive matrix organic EL display device is limited by its structure. Furthermore, as the number of conductive lines increases, the aperture ratio of a passive matrix organic EL display device decreases. In contrast, active matrix organic EL display devices are highly efficient and can produce a high-quality image for a large display with a relatively low power.

FIG. 1 is a schematic cross-sectional view of an organic EL display device according to the related art. In FIG. 1, an organic EL display device 10 includes first and second substrates 12 and 28 attached to each other by a sealant 26 with a space therebetween. An array element layer 14 is formed on the first substrate 12 and includes a thin film transistor (TFT) T. In addition, a first electrode 16, an organic electroluminescent (EL) layer 18 and a second electrode 20 are formed on the array element layer 14. The first electrodes 16 is connected to the TFT T. The organic EL layer 18 may separately display red, green, and blue colors in each pixel region P.

The organic EL display device 10 is encapsulated by attaching the first substrate 12 to the second substrate 28. The second substrate 28 includes an absorbent material 22 to eliminate moisture and oxygen that may penetrate into a capsule of the organic EL layer 18. After etching a portion of the second substrate 28, the etched portion is filled with the absorbent material 22 and the filled absorbent material 22 is fixed by a holding element 25.

FIG. 2 is a schematic circuit diagram of an array layer of an organic EL display device according to the related art. In FIG. 2, a gate line 36 is formed along a first direction, and a data line 49 is formed along a second direction intersected with the gate line 36, thereby defining a pixel region 30. A power line 62 also is formed along the second direction and spaced apart from the gate line 36. A switching element $T_S$ in the pixel region, and a storage capacitor $C_{ST}$ is connected between the switching element $T_S$ and the power supply line 62. A driving element $T_D$ electrically connects the switching element $T_S$ to an organic EL diode $D_{EL}$.

In particular, the storage capacitor $C_{ST}$ is between a driving gate electrode 34 and a driving source electrode 52 of the driving element $T_D$, as the driving element $T_D$ is a positive type transistor. The organic EL diode $D_{EL}$ is connected to the power line 62, and the driving drain electrode of the driving element $T_D$ may be connected to an anode of the organic EL diode $D_{EL}$. The switching element $T_S$ and the driving element $T_D$ can be a polycrystalline silicon TFT or an amorphous silicon TFT. The process of fabricating an amorphous silicon TFT is simpler than the process for a polycrystalline silicon TFT.

When a scan signal is applied to a switching gate electrode 32 of the switching element $T_S$ from the gate line 36, an image signal is applied to the driving gate electrode 34 of the driving element $T_D$ through the switching element $T_S$ from the data line 49. The current density of the driving element $T_D$ is modulated by the image signal applied to the driving gate electrode 34. As a result, the organic EL diode $D_{EL}$ can display images with gray scale levels. Moreover, because the image signal stored in the storage capacitor $C_{ST}$ is applied to the driving gate electrode 34, the current density flowing into the organic EL diode $D_{EL}$ is uniformly maintained until the next image signal is applied, even when the switching element $T_S$ is turned off.

However, when an array layer of TFTs and organic EL diodes are all formed on a single substrate, the production yield of an organic EL display device is determined by a product of the TFT's yield and the organic EL layer's yield. Since the organic EL layer's yield is relatively low, the production yield of the organic EL display device is limited by the organic EL layer's yield. For example, even when a TFT is properly fabricated, an organic EL display device can be determined to be unacceptable due to defects of the organic EL layer using a thin film of about 1000 Å thickness. Accordingly, this limitation causes loss of materials and an increase in production costs.

Organic EL display devices are classified into one of bottom emission-type organic EL display devices and top emission-type organic EL display devices based on a direction of light emitted from organic EL diodes. The bottom emission-type organic EL display devices are advantageous for their high image stability and variable fabrication processing due to encapsulation. However, the bottom emission-type organic EL display devices are not adequate for implementation in display devices that require high resolution due to the limitations of the increased aperture ratio.

On the other hand, since top emission-type organic EL display devices emit light along a direction upward of the substrate, light can be emitted without influencing the array layer that is located under the organic EL layer. Accordingly, the overall design of the array layer including TFTs may be simplified. In addition, the aperture ratio can be increased, thereby increasing the operational life span of the organic EL display.

However, since a cathode is commonly formed over the organic EL layer in the top emission-type organic EL display devices, material selection and light transmittance are limited such that light transmission efficiency is lowered. For instance, if a thin film type passivation layer is formed to prevent a reduction of the light transmittance, the thin film type passivation layer may fail to prevent infiltration of exterior air into the device.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic EL display device having an absorbent element, thereby effectively removing moisture in the organic EL display device and increasing product life span.

Another object of the present invention is to provide a method of fabricating an organic EL display device having an array layer and an organic electroluminescent diode on respective substrates.

Another object of the present invention is to provide an organic EL display device having uniform image quality.

Another object of the present invention is to provide a method of fabricating an organic EL display device having uniform image quality.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent device includes first and second substrates spaced apart from each other, the first and second substrates including a pixel region, an array element layer on an inner surface of the first substrate, the array element layer including a switching element and a driving element connected to the switching element, an organic electroluminescent diode on an inner surface of the second substrate, an absorbent element on one of the array element layer and the organic electroluminescent diode, a protective layer on the absorbent element, and a connection electrode electrically connecting the array element layer and the organic electroluminescent diode.

In another aspect, a method of fabricating an organic electroluminescent device includes forming an array element layer on a first substrate, the array element layer including a switching element and a driving element connected to the switching element, forming an organic electroluminescent diode in a pixel region of a second substrate, forming an absorbent element on one of the array element layer and the organic electroluminescent diode, forming a protective layer on the absorbent element, forming a connection electrode, and attaching the first and second substrates to each other such that the connection electrode electrically connecting the array element layer and the organic electroluminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
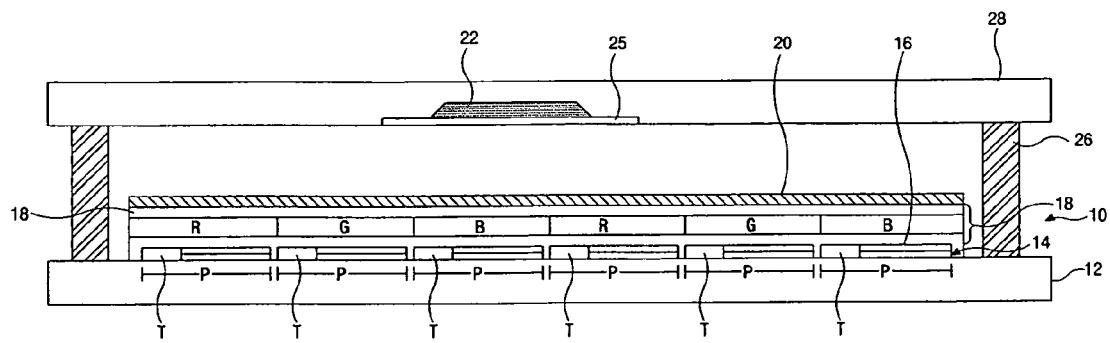
FIG. 1 is a schematic cross-sectional view of an organic EL display device according to the related art.
Figure 2:
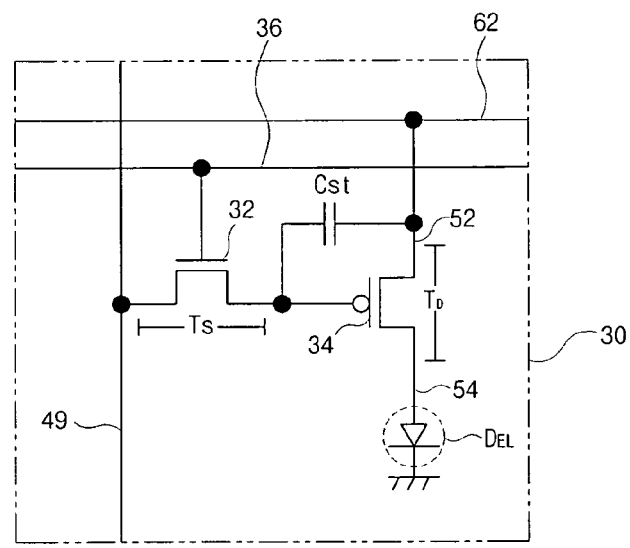
FIG. 2 is a schematic circuit diagram of an array layer of an organic EL display device according to the related art.
Figure 3:
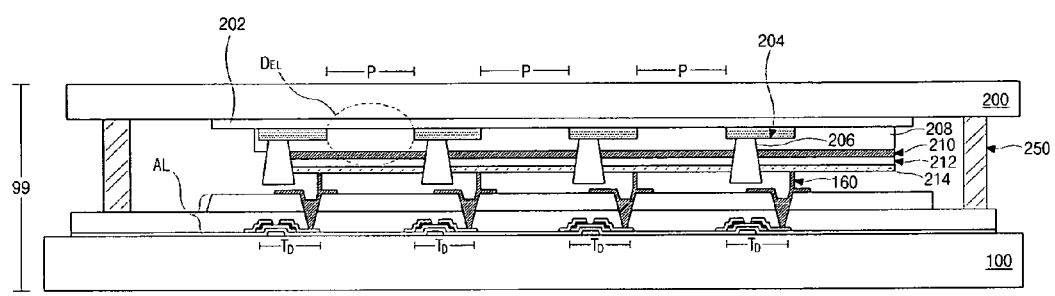
FIG. 3 is a schematic cross-sectional view of a dual panel type organic EL display device according to an embodiment of the present invention.

FIG. 3 is a schematic cross-sectional view of a dual panel type organic EL display device according to an embodiment of the present invention. In FIG. 3, an organic EL display device 99 includes a first substrate 100 and a second substrate 200 attached to each other by a sealant 250 with a predetermined space therebetween. An array element layer AL is formed on the first substrate 100, and an organic EL diode $D_{EL}$ is formed on the second substrate 200. The organic EL display device 99 includes a plurality of pixel regions P within a display region.

In particular, the array element layer AL includes a driving thin film transistor (TFT) $T_D$ in each of the pixel regions P. Although not shown, the array element layer AL additionally may include a scan line, a signal line and a power supply line intersected the scan line, a switching thin film transistor disposed at an intersection of the scan line and the signal line, and a storage capacitor.

In addition, the organic EL diode $D_{EL}$ includes a first electrode 202 as a common electrode, a barrier layer 204 corresponding to a boundary region of the pixel regions P, an organic EL layer 208 and a second electrode 210. The first electrode 202 may be along an inner surface of the second substrate 200 as a common electrode and as an anode, and the second electrode 210 may function as a cathode. In particular, the first electrode 202 may be formed of a transparent conductive material, such as one of indium-tin-oxide (ITO), indium-zinc-oxide (IZO) and indium-tin-zinc-oxide (ITZO). The second electrode 210 may be formed of an opaque metallic material having a low work function.

Further, a separator 206 is formed on the barrier layer 204 in the boundary region of the pixel regions P. The separator 206 may have an inverted tapered shape with respect to the second substrate 200 in cross-sectional view. In particular, the organic EL layer 208 and the second electrode 210 may be divided by the separator 206. Thus, the organic EL layer 208 and the second electrode 210 are isolated in each of the pixel regions P.

Moreover, an absorbent layer 212 is formed on the second electrode 210 and a protective layer 214 is formed on the absorbent layer 212 to protect the absorbent layer 212. The absorbent layer 212 absorbs moisture in an interior of the organic EL display device 99, thereby increasing product life span. Further, the protective layer 214 prevents the absorbent layer 212 from being exposed in an atmospheric condition even when the first and second substrates 100 and 200 are under an atmospheric condition. The ability of the absorbent layer 212 cannot be regularly controlled under atmospheric gases, but by forming the protective layer 214, the absorbent layer 212's ability of removing moisture can be regularly controlled.

A connection electrode 160 is formed between the first and second substrates 100 and 200 having a thickness corresponding to a cell gap between the first and second substrates 100 and 200. In particular, a top surface of the connection electrode 160 may contact the protective layer 214 of the second substrate 200 and a bottom surface of the connection electrode 160 may contact the driving TFT $T_D$ of the first substrate 100 to electrically connect the first and second substrates 100 and 200.

Thus, the absorbent layer 212 and the protective layer 214 may be formed of conductive metallic materials. For instance, the absorbent layer 212 may include one of Group IV-A element, such as zirconium (Zr), titanium (Ti) and hafnium (Hf), Group V-A element, such as vanadium (V), niobium (Nb), tantalum (Ta), chromium (Cr), molybdenum (Mo) and tungsten (W), Group VII-A element, such as iron (Fe), ruthenium (Ru) and osmium (Os), and Group VIII-A element, such as nickel (Ni) and cobalt (Co). Further, the absorbent layer 212 may be selected from one of Group I-B, Group III-B, Group I-A, and Group V-B elements. In addition, the protective layer 214 may be selected from one of platinum (Pt) and nickel (Ni).

Figure 4A:
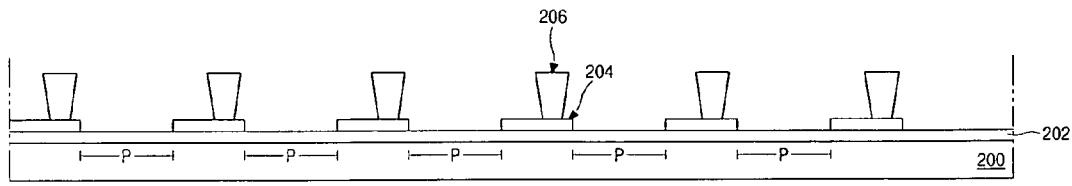
FIGS. 4A to 4C are schematic cross-sectional views of a method of fabricating a substrate having an organic EL diode for a dual panel type organic EL display device according to an embodiment of the present invention.
Figure 4B:
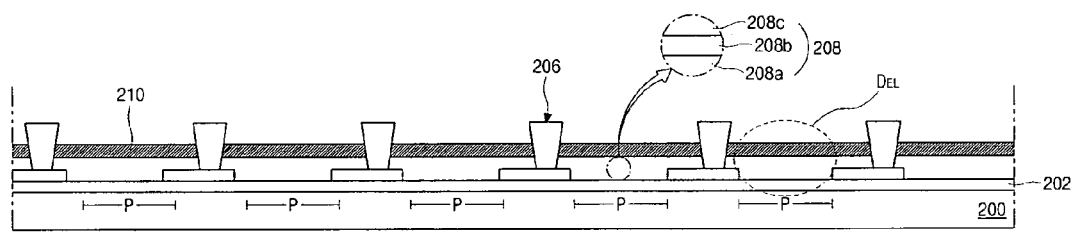
Figure 4C:
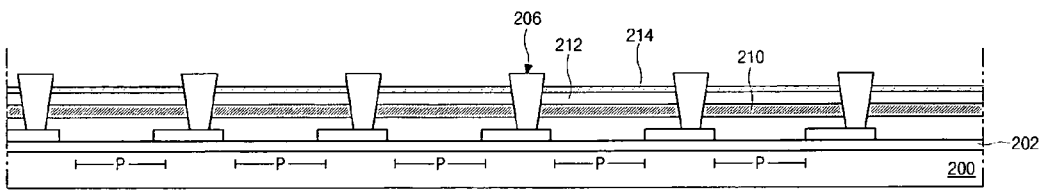

FIGS. 4A to 4C are schematic cross-sectional views of a method of fabricating a substrate having an organic EL diode for a dual panel type organic EL display device according to an embodiment of the present invention. In FIG. 4A, a first electrode 202 is formed on a second substrate 200. The first electrode 202 may be formed within the entire display region of the second substrate 200 including a plurality of pixel regions. A barrier layer 204 is formed on the first electrode 202 in a boundary region of the pixel regions P, and a separator 206 having an inverted tapered shape with respect to the second substrate 200 is formed on the barrier layer 204 in the boundary region. The first electrode 202 may function as an anode and may be formed of a transparent conductive materials, such as one of indium tin oxide (ITO), indium zinc oxide (IZO), and indium tin zinc oxide (ITZO). Further, the barrier layer 204 prevents the first electrode 202 and a later-formed second electrode from shorting.

In FIG. 4B, an organic EL layer 208 is formed on the first electrode 202 in the pixel regions P. In particular, the organic EL layer 208 may be divided by the separator 206 and may include red, green, and blue organic EL material layers in each of the pixel regions P. Further, the organic EL layer 208 may be formed as one of a single layer or multiple layers. For instance, the organic EL layer 208 may include a hole transporting layer 208a, a luminescent layer 208b and an electron transporting layer 208c sequentially formed on the first electrode 202.

In addition, a second electrode 210 is formed on the organic EL layer 208 in the pixel regions P. The second electrode 210 also may be divided by the separator 206 and may be formed as a single layer or multiple layers. For instance, the second electrode 210 may include one of aluminum (Al), calcium (Ca), or magnesium (Mg). Alternatively, the second electrode 210 may includes double metal layers, such as lithium fluorine/aluminum (LiF/Al).

Although the organic EL layer 208 and the second electrode 210 may be automatically divided by the separator 206 to correspond the pixel regions P, they may have pixellation shape by using a shadow mask process instead of using the separator 206. Further, the first electrode 202, the organic EL layer 208, and the second electrode 210 constitute an organic EL diode $D_{EL}$.

In FIG. 4C, an absorbent layer 212 and a protective layer 214 are sequentially formed on the second electrode 210. The absorbent layer 212 and the protective layer 214 may be divided by the separator 206 corresponding to the pixel regions P. Further, the absorbent layer 212 and the protective layer 214 may be formed of conductive metallic materials. For example, the absorbent layer 212 may be selected from one of Group IV-A element, such as zirconium (Zr), titanium (Ti) and hafnium (Hf), Group V-A element, such as vanadium (V), niobium (Nb), tantalum (Ta), chromium (Cr), molybdenum (Mo) and tungsten (W), Group VII-A element, such as iron (Fe), ruthenium (Ru) and osmium (Os), and Group VIII-A element, such as nickel (Ni) and cobalt (Co). Further, the absorbent layer 212 may be selected from one of Group I-B, Group III-B, Group I-A, and Group V-B elements. In addition, the protective layer 214 may be selected from one of platinum (Pt) and nickel (Ni).

Figure 5A:
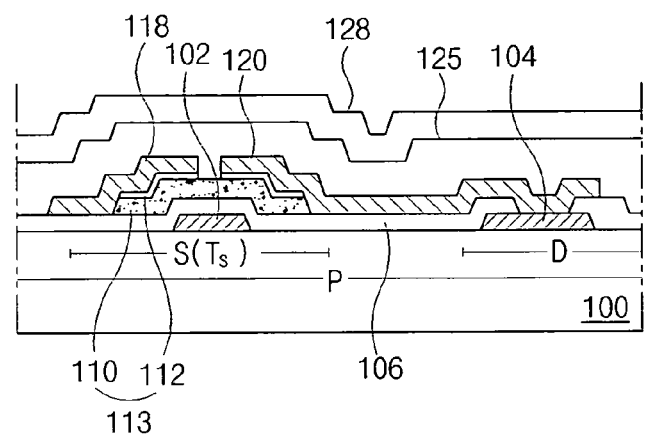
FIGS. 5A and 5B are schematic cross-sectional views of a method of fabricating a substrate having an array element layer for a dual panel type organic EL display device according to an embodiment of the present invention.
Figure 5B:
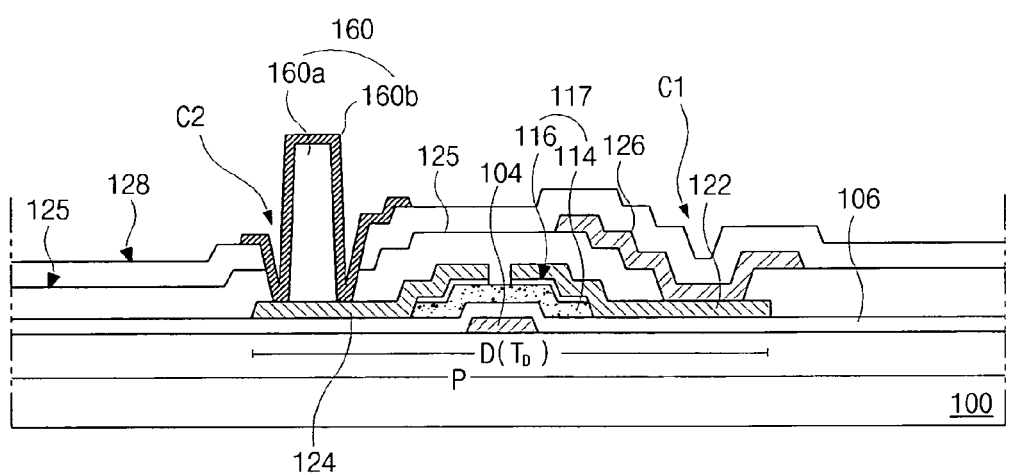

FIGS. 5A and 5B are schematic cross-sectional views of a method of fabricating a substrate having an array element layer for a dual panel type organic EL display device according to an embodiment of the present invention. As shown in FIGS. 5A and 5B, a first substrate 100 is prepared, and a pixel region P is defined in the first substrate 100. The pixel region P includes a switching region S and a driving region D.

Switching and driving gate electrodes 102 and 104 are formed in the switching region S and the driving region D, respectively. A gate insulating layer 106 is formed over the entire surface of the first substrate 100 having the switching and driving gate electrodes 102 and 104. Then, switching and driving active layers 110 and 114 and switching and driving ohmic contact layers 112 and 116 are sequentially formed on the gate insulating layer 106 in the switching region S and the driving region D, respectively. For example, the switching and driving active layers 110 and 114 may include intrinsic amorphous silicones, and the switching and driving ohmic contact layers 112 and 116 may include impurity amorphous silicones. As a result, the switching and driving active layers 110 and 114 and the switching and driving ohmic contact layers 112 and 116 may constitute first and second semiconductor layers 113 and 117.

In addition, switching and driving source electrodes 118 and 122 and switching and driving drain electrodes 120 and 124 are formed on the switching and driving ohmic contact layers 112 and 116, respectively, and are spaced apart from each other. Although not shown, the portion of the switching and driving active layers 110 and 114 is exposed by removing the switching and driving ohmic contact layers 112 and 116 in the spaced portion between the switching and driving active layers 110 and 114, and the switching and driving ohmic contact layers 112 and 116 to defined a channel portion (not shown).

Further, the first drain electrode 120 is connected to the second gate electrode 104. The switching gate electrode 102, the switching semiconductor layer 113, the switching source electrode 118 and the switching drain electrode 120 may constitute a switching element $T_S$ in the switching region S. The driving gate electrode 104, the driving semiconductor layer 117, the driving source electrode 122 and the driving drain electrode 124 may constitute a driving element $T_D$ in the driving region D.

Moreover, a first passivation layer 125 is formed over an entire surface of the first substrate 100 having the switching element $T_S$ and the driving element $T_D$ and has a first contact hole C1 that exposes the portion of the second source electrode 122. For example, the first passivation layer 125 may be selected from inorganic insulating materials. In addition, a power line 126 is formed on the first passivation layer 125 and is connected to the second source electrode 122 via the first contact hole C1. A second passivation layer 128 is formed over an entire surface of the first substrate 100 having the power line 126 and has a second contact hole C2 that exposes the portion of the second drain electrode 124.

A connection electrode 160 is formed on the second passivation layer 128 and is connected to the second drain electrode 124 via the second contact hole C2. Although not shown, the connection electrode 160 electrically connects the first substrate 100 and the second substrate 200 (of FIG. 3). The connection electrode 160 is selected from conductive metallic materials. Further, to form as the thickness corresponding to the gap between the first substrate 100 and the second substrate 200, the connection electrode 160 includes an organic pattern 160a of having a definite thickness and a metal layer 160b covering the organic pattern 160a.

Figure 6:
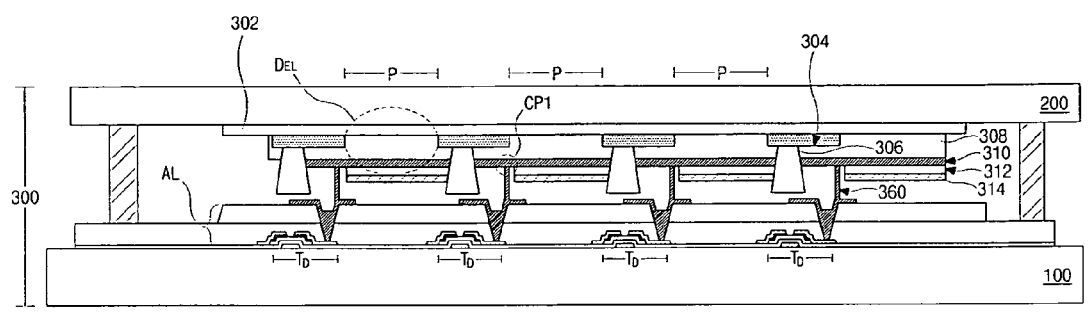
FIG. 6 is a schematic cross-sectional view of a dual panel type organic EL display device according to another embodiment of the present invention.

FIG. 6 is a schematic cross-sectional view of a dual panel type organic EL display device according to another embodiment of the present invention. In FIG. 6, an organic EL display device 300 includes a first substrate 100 and a second substrate 200 attached to each other by a sealant with a predetermined space therebetween. An array element layer AL is formed on the first substrate 100, and an organic EL diode $D_{EL}$ is formed on the second substrate 200. The organic EL display device 300 includes a plurality of pixel regions P within a display region and a connection electrode 360 electrically connecting the first and second substrates 100 and 200.

The array element layer AL includes a driving thin film transistor (TFT) $T_D$ and a switching TFT (not shown) in each of the pixel regions P. In addition, the organic EL diode $D_{EL}$ includes a first electrode 302, a barrier layer 304 corresponding to a boundary region of the pixel regions P, an organic EL layer 308 and a second electrode 310. Further, a separator 306 is formed on the barrier layer 304 in the boundary region of the pixel regions P. The separator 306 may have an inverted tapered shape with respect to the second substrate 200 in cross-sectional view.

Moreover, an absorbent layer 312 and a protective layer 314 are sequentially formed on the second electrode 310. In particular, the absorbent layer 312 and the protective layer 314 are located in the pixel regions P excluding a first connection portion CP1. The first connection portion CP1 may be a region where the second electrode 310 connects to the connection electrode 360. Thus, the absorbent layer 312 and the protective layer 314 do not contact the connection electrode 360.

Accordingly, the second electrode 310 directly contacts the connection electrode 360 without being connected to the absorbent layer 312 and the protective layer 314. The absorbent layer 312 and the protective layer 314 may include the same materials as the absorbent layer 212 (shown in FIG. 3), but they may be selected from other materials, such non-conductive materials. For instance, the absorbent layer 312 may be selected from materials having a good absorption ability, and the protective layer 314 may be selected from materials having a good protection ability for the absorbent layer 312. Further, the absorbent layer 312 may be selected from metallic materials having a poor conductivity.

Figure 7:
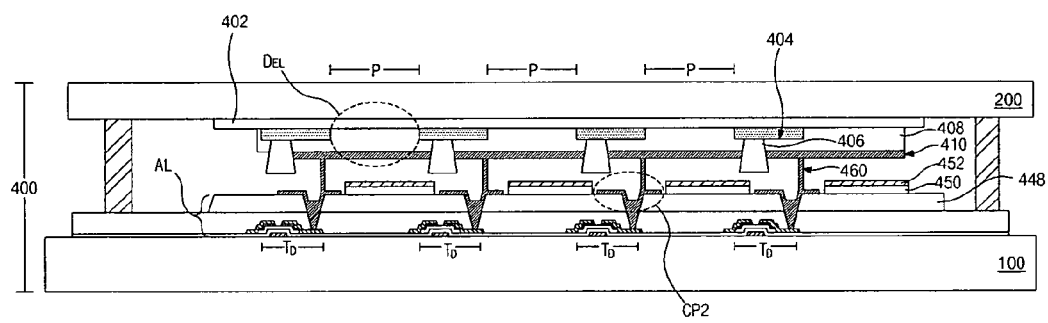
FIG. 7 is a schematic cross-sectional view of a dual panel type organic EL display device according to another embodiment of the present invention.

FIG. 7 is a schematic cross-sectional view of a dual panel type organic EL display device according to another embodiment of the present invention. In FIG. 7, an organic EL display device 400 includes a first substrate 100 and a second substrate 200 attached to each other by a sealant with a predetermined space therebetween. An array element layer AL is formed on the first substrate 100, and an organic EL diode $D_{EL}$ is formed on the second substrate 200. The organic EL display device 400 includes a plurality of pixel regions P within a display region and a connection electrode 460 electrically connecting the first and second substrates 100 and 200.

The array element layer AL includes a driving thin film transistor (TFT) $T_D$ and a switching TFT (not shown) in each of the pixel regions P. In addition, the organic EL diode $D_{EL}$ includes a first electrode 402, a barrier layer 404 corresponding to a boundary region of the pixel regions P, an organic EL layer 408 and a second electrode 410. Further, a separator 406 is formed on the barrier layer 404 in the boundary region of the pixel regions P. The separator 406 may have an inverted tapered shape with respect to the second substrate 200 in cross-sectional view.

Moreover, an absorbent layer 450 and a protective layer 452 are sequentially formed on the array element layer AL. Specifically, an insulating layer 448 is formed between the absorbent layer 450 and the protective layer 452. Further, the absorbent layer 450 and the protective layer 452 are located in the pixel regions P excluding a second connection portion CP2. Thus, the insulating layer 448 may be formed on an entire surface of the first substrate 100 over the array element layer AL and may have an contact hole corresponding to the second connection portion CP2 and exposing a drain electrode of the driving TFT $T_D$. The second connection portion CP2 may be a region where the second electrode 410 connects to the connection electrode 460.

Thus, the absorbent layer 450 and the protective layer 452 do not contact the connection electrode 460. As a result, the insulating layer 448 may function as the second passivation layer 128 (shown in FIG. 5B). The absorbent layer 450 and the protective layer 452 may include the same materials as the absorbent layer 312 and the protective layer 314 (shown in FIG. 6).

According to an embodiment of the present invention, the organic EL display device is a top emission type EL display device which emits light emitted from the organic EL layer toward the substrate the organic EL layer is formed thereon. Further, the organic EL display device and the method of fabricating the same according to an embodiment of the present invention have an advantage in that the production yield and the efficiency of the production management are improved, and the thin film transistor can be easily designed and the high aperture ratio/high resolution can be achieved.

In addition, since an array element layer including a TFT and an organic EL diode may be independently formed on respective substrates, undesired effects due to fabrication processes of the organic EL diode may be prevented, thereby improving overall production yield. Furthermore, because the organic EL display device includes an absorbent layer and a protective layer for the absorbent layer, moisture in the device is effectively removed, thereby lengthening the product life span.

It will be apparent to those skilled in the art that various modifications and variations can be made in the organic electroluminescent display device and the method of fabricating the same of the present invention without departing from the sprit or scope of the invention. Thus, it is intended that the present invention covers the modifications and variations of this invention provided they come within the scope of the appended claims and their equivalents.

What is claimed is:

1. An organic electroluminescent device, comprising:
   first and second substrates spaced apart from each other, the first and second substrates including a pixel region;
   an array element layer on an inner surface of the first substrate, the array element layer including a switching element and a driving element connected to the switching element;
   an organic electroluminescent diode in the pixel region on an inner surface of the second substrate;
   a separator in a boundary region of the pixel region on the inner surface of the second substrate;
   an absorbent element in the pixel region on one of the array element layer and the organic electroluminescent diode;
   a protective layer contact and directly on the absorbent element such that the protective layer protects the absorbent element and the absorbent element's ability of removing moisture is regularly controlled, wherein the absorbent element and the protective layer are disposed between adjacent separators, and the absorbent element and the protective layer are disposed between the array element layer and the organic electroluminescent diode; and
   a connection electrode electrically connecting the array element layer and the organic electroluminescent diode.

2. The device according to claim 1, wherein the protective layer protects the absorbent element from atmosphere gases.

3. The device according to claim 1, wherein the absorbent element includes one of Group IV-A, Group V-A, Group VII-A, Group VIII-A, Group I-B, Group III-B, Group I-A, and Group V-B elements.

4. The device according to claim 1, wherein the protective layer includes one of platinum (Pt) and nickel (Ni).

5. The device according to claim 1, wherein the organic electroluminescent diode includes a first electrode on the inner surface of the second substrate, an organic electroluminescent layer on the first electrode, and a second electrode on the organic electroluminescent layer, the absorbent element contacting the second electrode.

6. The device according to claim 5, wherein the protective layer directly contacts the connection electrode, the absorbent element electrically contacts the protective layer, and the second electrode is electrically connected to the connection electrode through the absorbent element and protective layer.

7. The device according to claim 1, wherein the absorbent element contacts the second electrode and is spaced apart from the connection electrode.

8. The device according to claim 1, wherein the absorbent element is formed on the array element layer and spaced apart from the connection electrode.

9. The device according to claim 8, further comprising an insulating layer between the absorbent element and the array element layer.

10. The device according to claim 1, wherein the array element layer includes a gate line along a first direction, a data line crosses the gate line along a second direction, and a power line is connected to the driving element.

11. A method of fabricating an organic electroluminescent device, comprising:
    defining first and second substrates including a pixel region;
    forming an array element layer on the first substrate, the array element layer including a switching element and a driving element connected to the switching element;
    forming an organic electroluminescent diode in the pixel region of the second substrate;
    forming a separator in a boundary region of the pixel region on the second substrate;
    forming an absorbent element in the pixel region on one of the array element layer and the organic electroluminescent diode;
    forming a protective layer contact and directly on the absorbent element such that the protective layer protects the absorbent element and the absorbent element's ability of removing moisture is regularly controlled;
    forming a connection electrode; and
    attaching the first and second substrates to each other such that the connection electrode electrically connecting the array element layer and the organic electroluminescent diode, wherein the absorbent element and the protective layer are disposed between adjacent separators, and the absorbent element and the protective layer are disposed between the array element layer and the organic electroluminescent diode.

12. The method according to claim 11, wherein the protective layer protects the absorbent element from atmosphere gases.

13. The method according to claim 11, wherein the absorbent element is formed of one of Group IV-A, Group V-A, Group VII-A, Group VIII-A, Group I-B, Group III-B, Group I-A, and Group V-B elements.

14. The method according to claim 11, wherein the protective layer is formed of one of platinum (Pt) and nickel (Ni).

15. The method according to claim 11, wherein the step of forming the organic electroluminescent diode includes
    forming a first electrode on the second substrate;
    forming an organic electroluminescent layer on the first electrode; and
    forming a second electrode on the organic electroluminescent layer, the absorbent element contacting the second electrode.

16. The method according to claim 15, wherein the protective layer directly contacts the connection electrode, the absorbent element electrically contacts the protective layer, and the second electrode is electrically connected to the connection electrode through the absorbent element and protective layer.

17. The method according to claim 11, wherein the absorbent element is formed on the second electrode and spaced apart from the connection electrode.

18. The method according to claim 11, wherein the absorbent element is formed on the array element layer and spaced apart from the connection electrode.

19. The method according to claim 18, further comprising forming an insulating layer between the absorbent element and the array element layer.

20. The method according to claim 11, wherein the step of forming the array element layer includes
    forming a gate line along a first direction;
    forming a data line crossing the gate line along a second direction; and
    forming a power line connected to the driving element.

* * * * *